(12) United States Patent
Zung et al.

(10) Patent No.: US 8,500,344 B2
(45) Date of Patent: Aug. 6, 2013

(54) COMPACT CAMERA MODULE AND METHOD FOR FABRICATING THE SAME

(75) Inventors: Pai-Chun Peter Zung, Hsinchu (TW); Jau-Jan Deng, Taipei (TW); Wei-Ping Chen, Taipei County (TW)

(73) Assignees: VisEra Technologies Co., Ltd., Hsinchu (TW); OmniVision Technologies Inc., Santa Clara, CA (US)

( * ) Notice: Subject to any disclaimer, the term of this patent is extended or adjusted under 35 U.S.C. 154(b) by 15 days.

(21) Appl. No.: 13/189,899

(22) Filed: Jul. 25, 2011

(65) Prior Publication Data

US 2013/0028589 A1 Jan. 31, 2013

(51) Int. Cl.
*G03B 17/00* (2006.01)
*G02B 7/02* (2006.01)

(52) U.S. Cl.
USPC ............................ 396/529; 359/819; 348/340

(58) Field of Classification Search
USPC .................... 396/529; 348/335, 340; 359/819
See application file for complete search history.

(56) References Cited

U.S. PATENT DOCUMENTS

| 7,663,686 | B2 * | 2/2010 | Chen | 348/335 |
|---|---|---|---|---|
| 7,755,857 | B2 * | 7/2010 | Yu | 359/819 |
| 2009/0080094 | A1 * | 3/2009 | Chen | 359/819 |
| 2009/0268439 | A1 * | 10/2009 | Chen | 362/183 |
| 2009/0279191 | A1 * | 11/2009 | Yu | 359/819 |
| 2011/0058265 | A1 * | 3/2011 | Chang et al. | 359/793 |
| 2011/0069395 | A1 * | 3/2011 | Lin et al. | 359/619 |
| 2011/0249350 | A1 * | 10/2011 | Hsueh | 359/811 |

* cited by examiner

*Primary Examiner* — Christopher Mahoney
(74) *Attorney, Agent, or Firm* — Muncy, Geissler, Olds & Lowe, PLLC

(57) ABSTRACT

The invention provides a compact camera module and a method for fabricating the same. A compact camera module includes an image sensor device package. A back spacer ring is disposed on the image sensor device package. A first edge of the back spacer ring is aligned to a second edge of the image sensor device package. An optical lens plate disposed over the back spacer ring. A front spacer ring is sandwiched between the back spacer ring and the optical lens plate. A third edge of the front spacer ring is aligned to a fourth edge of the optical lens plate.

18 Claims, 10 Drawing Sheets

COMPACT CAMERA MODULE AND METHOD FOR FABRICATING THE SAME

BACKGROUND OF THE INVENTION

1. Field of the Invention

The present invention relates to a compact camera module and a method for fabricating the same, and in particular, to a compact camera module using a wafer level packaging process with a reduced lens diameter and a method for fabricating the same.

2. Description of the Related Art

The conventional compact camera module is fabricated by laminating lenses on a substrate having optical devices thereon through a spacer ring having an opening therethrough, and then the substrate laminated with the lenses is diced and divided into several individual compact camera module units. Therefore, a die size of the lens of the conventional compact camera module is usually defined by a size of an optical device or the opening of the spacer ring. If some design considerations such as a longer focus length of the optical device or a larger size of the optical device are required, a larger sized opening formed through the spacer ring is needed to prevent light scattering effects during module lamination processes or to prevent image quality reduction due to light shielding by the spacer ring. Therefore, it is difficult to reduce the die size of a lens of a conventional compact camera module.

Thus, a novel compact camera module with a reduced lens size and a method for fabricating the same are desired.

BRIEF SUMMARY OF INVENTION

A compact camera module and a method for fabricating the same are provided. An exemplary embodiment of a compact camera module comprises an image sensor device package. A back spacer ring is disposed on the image sensor device package. A first edge of the back spacer ring is aligned to a second edge of the image sensor device package. An optical lens plate disposed over the back spacer ring. A front spacer ring is sandwiched between the back spacer ring and the optical lens plate. A third edge of the front spacer ring is aligned to a fourth edge of the optical lens plate.

A method for fabricating a compact camera module comprises providing a first portion comprising an image sensor device package with a back spacer ring bonded thereon. A first edge of the back spacer ring is aligned to a second edge of the image sensor device package. A second portion is provided comprising an optical lens plate with a front spacer ring bonded thereunder. A third edge of the front spacer ring is aligned to a fourth edge of the optical lens plate. The second portion is bonded onto the first portion. The front spacer ring is sandwiched between the back spacer ring and the optical lens plate.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
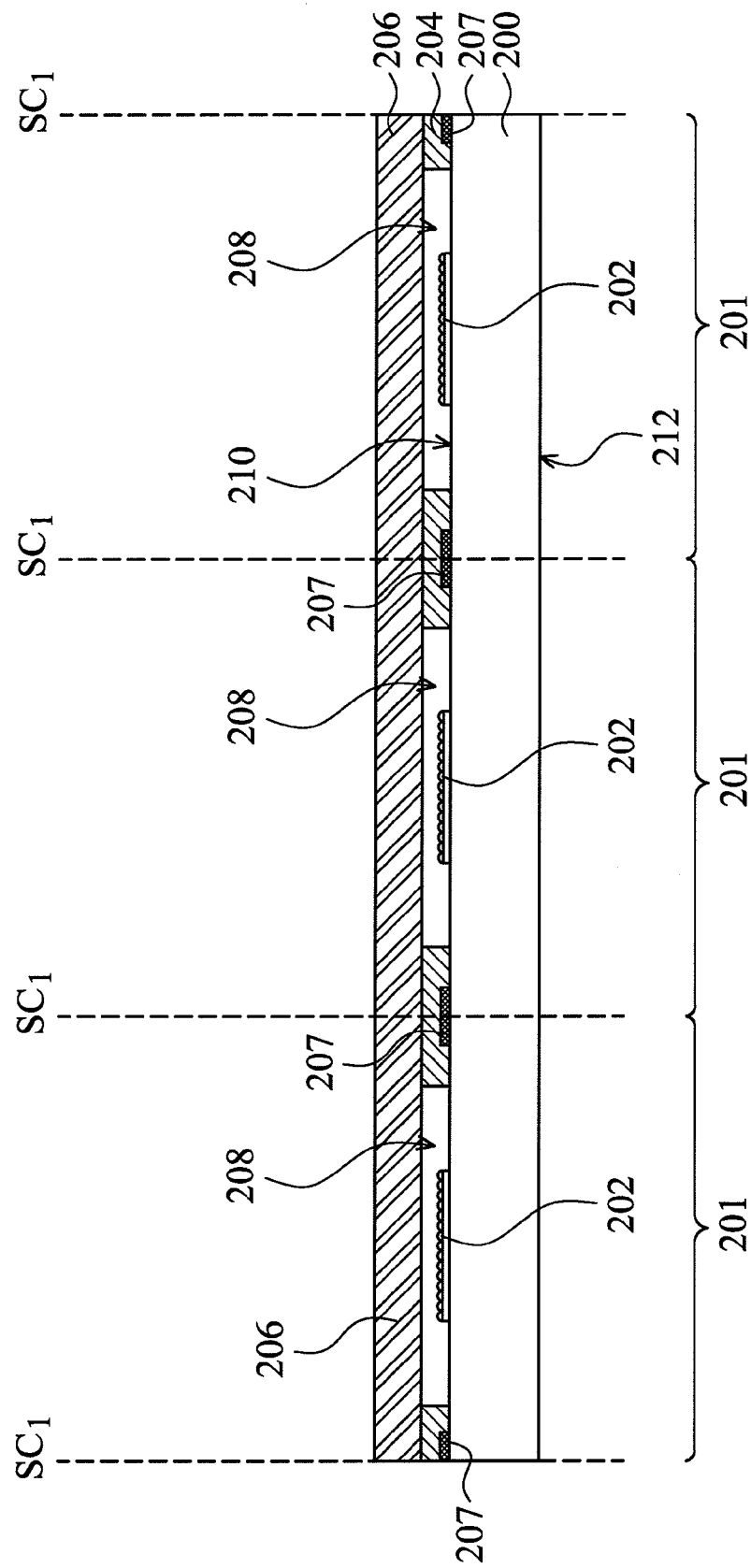
FIGS. 1-7 are cross section views showing one exemplary embodiment of a method for fabricating a compact camera module of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

One exemplary embodiment provides a compact camera module and a method for fabricating the same. The compact camera module is composed of a first portion bonded to a second portion fabricated by a wafer level packaging process, where the first portion comprises an image sensor device package with a back spacer ring bonded thereon, and an edge of the back spacer ring is as aligned to that of the image sensor device package. The second portion comprises an optical lens plate with a front spacer ring bonded thereunder, and an edge of the front spacer ring is as aligned to that of the optical lens plate. FIGS. 1-7 are cross section views showing one exemplary embodiment of a method for fabricating a compact camera module 500 of the invention. Referring to FIG. 1, firstly, a wafer 200 having an upper surface 210 and a lower surface 212 is provided. The wafer 200 comprises image sensor device chips 201 isolated from one another by scribe lines SC1. A plurality of image sensor devices 202 and conductive pads 207 belonging to the image sensor device chips 201 is disposed on the upper surface 210 of the wafer 200. In one embodiment, the wafer 200 may comprise a semiconductor wafer such as silicon wafer. In one embodiment, the image sensor devices 202 may comprise complementary metal-oxide-semiconductor (CMOS) devices or charge-coupled devices (CCDs). Next, the upper surface 210 of the wafer 200 is bonded to a transparent plate 206 with a dam 204 therebetween using an adhesive layer (not shown) disposed on the dam 204 to form first cavities 208 surrounded by the transparent plate 206, the wafer 200 and the dam 204. The image sensor device devices 202 are disposed in the first cavities 208, respectively. In one embodiment, the transparent plate 206 may comprise glass or quartz, so that light may pass therethrough and be sensed by the image sensor devices 202. In one embodiment, the dam 204 may comprise isolation materials.

Figure 2:
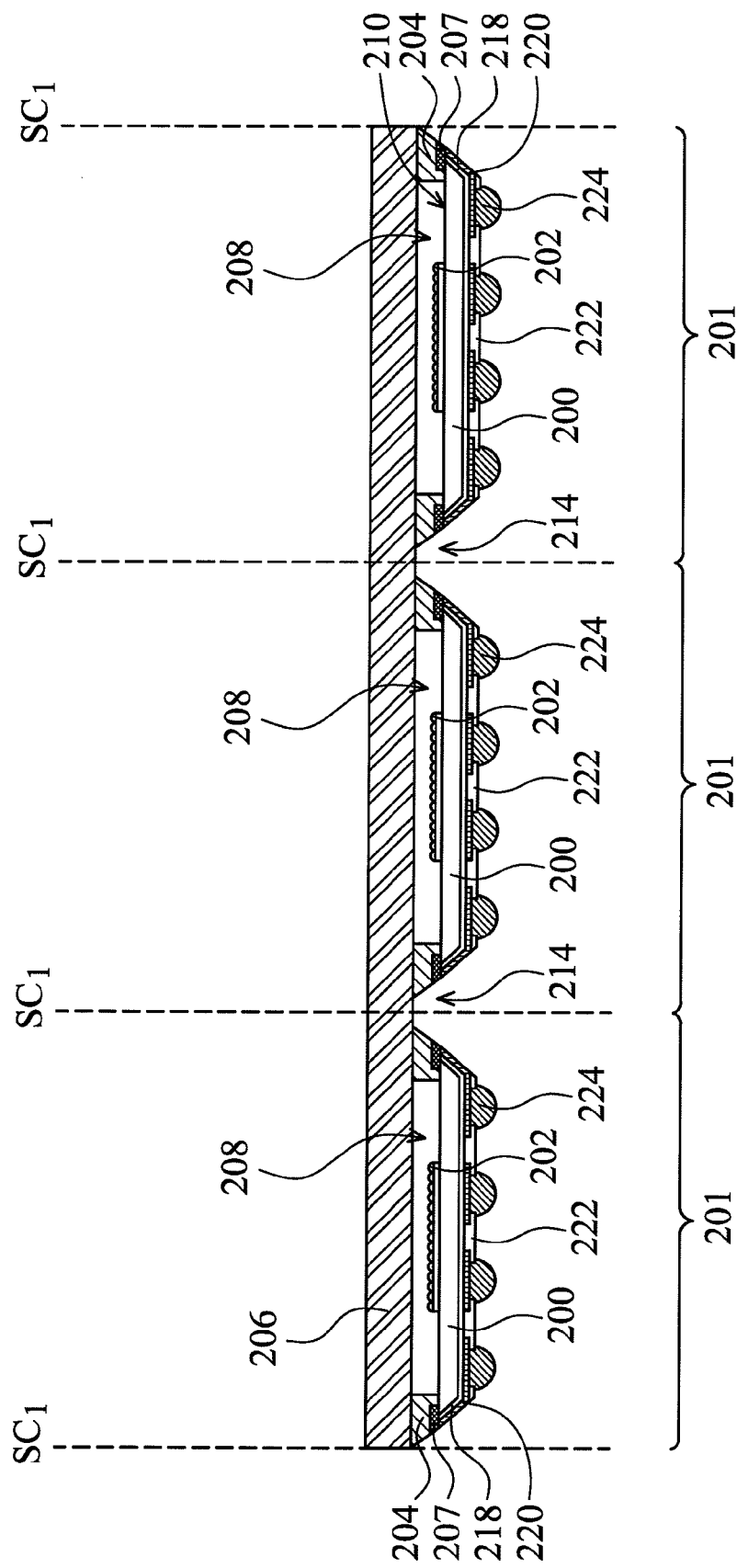

Next, referring to FIG. 2, a thinning process may be performed on the lower surface 212 of the wafer 200 to a preferred thickness by an etching, or milling process, or grinding and polishing process. Next, a portion of the wafer 200 substantially along the scribe lines SC1 from the lower surface 212 of the wafer 200 is removed by a process such as an anisotropic etching process to form through holes 214 through the wafer 200, exposing the conductive pad 207. The through holes 214 are adjacent to edges of image sensor devices 202, and positions of the through holes 214 are substantially aligned to positions of the scribe lines SC1.

Next, an insulating layer 218 is conformably formed on bottom surfaces and sidewalls of the through holes 214, extending to the lower surface 212 of the image sensor device chips 201 of the wafer 200 by a thermal oxidation or plasma chemical vapor deposition method. Next, the insulating layer 218 on the bottom surfaces of the through holes 214 is removed by a photolithography process to expose the conductive pad 207. In one embodiment, the insulating layer 218 may comprises isolation materials such as silicon oxide, silicon nitride or polyimide.

Next, a conductive layer 220 is conformably formed in through holes 214, covering the conductive pad 207, extending over the insulating layer 218 on the sidewalls and the on the lower surface 212 of the image sensor device chips 201 of the wafer 200. The conductive layer 220 electrically connects to the image sensor devices 202 of the image sensor device chips 201 through the conductive pads 207. Next, the conductive layer 220 on bottom surfaces of the through holes 214 is removed by processes, such as a photolithography process, to expose the transparent plate 206 from the bottom surfaces of the through holes 214. In one embodiment, the conductive layer 220 may be formed of metal materials, for example, Cu, Al, Ag or combinations thereof. The conductive layer 220 may extend the conductive path of the image sensor devices 202 from the conductive pads 207 on the upper surface 210 to the lower surface 212 of the image sensor device chips 201 of the wafer 200 along the sidewall of the through holes 214.

Next, a passivation layer 222 such as a solder mask may cover the lower surface 212 of the image sensor device chips 201 of the wafer 200 by a coating method. Next, a patterning process is performed on the passivation layer 222 to form openings (not shown) exposing a portion of the conductive layer 220. Next, under bump metallurgy (UBM) layers (not shown) and conductive bumps 224 are sequentially formed in positions of the openings. In each of the image sensor device chips 201 of the wafer 200, the conductive bumps 224 are electrically connected to the image sensor device 202 through the conductive layer 220 and the conductive pads 207.

Figure 3:
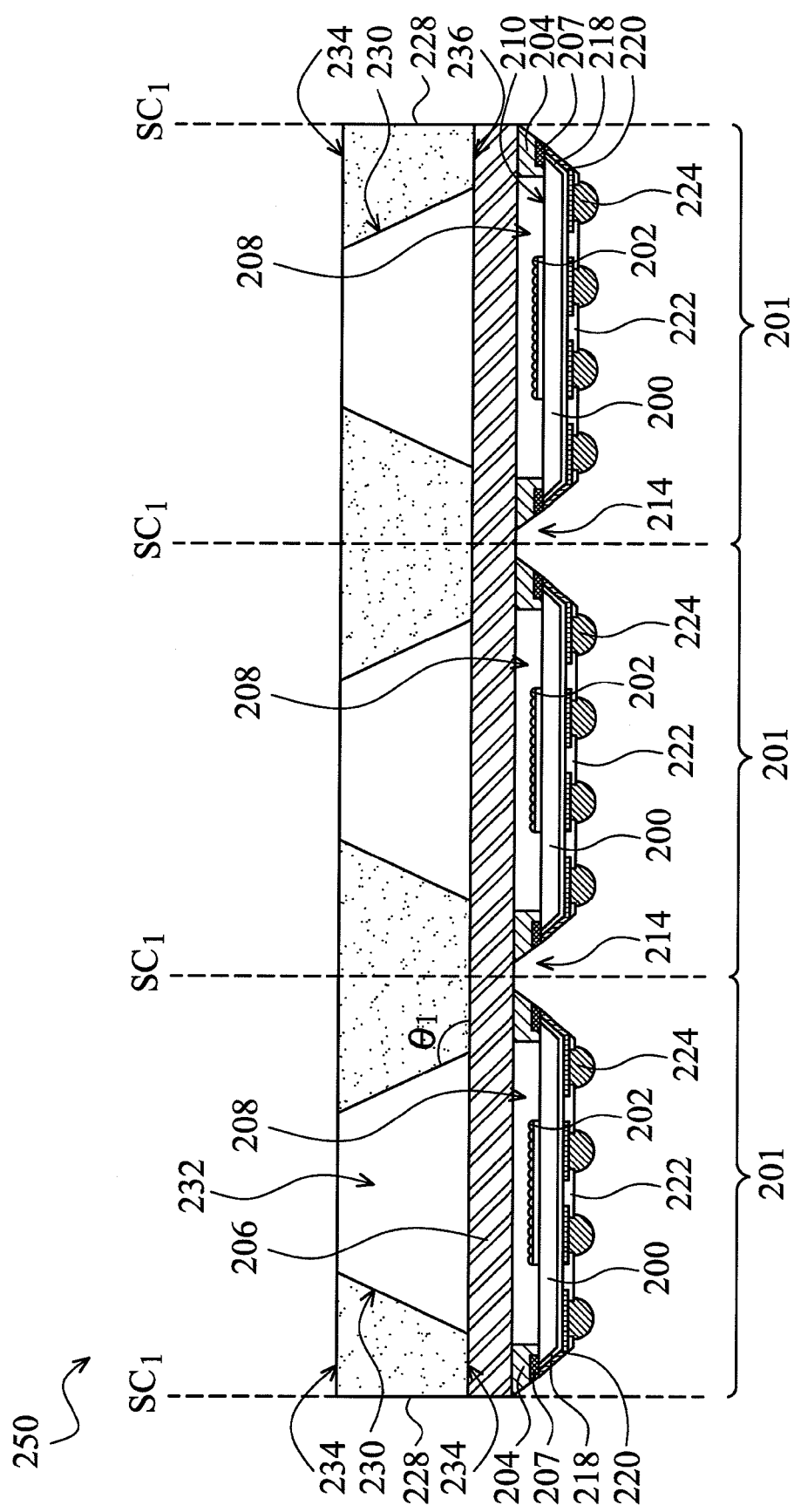

Next, referring to FIG. 3, a back spacer ring 228 is bonded on the wafer 200, connecting to the transparent plate 206. The back spacer ring 228 has cavities 232 formed therethrough and surrounds each of the image sensor devices 202 of the image sensor device chips 201 of the wafer 200. In one embodiment, the back spacer ring 228 may be formed of thermal-resistant and reflowable materials such as glass, metals or plastics. As shown in FIG. 3, in one embodiment, the back spacer ring 228 may have a lean inner sidewall 230. An angle $\theta_1$ between the inner sidewall 230 and the bottom surface 236 of the back spacer ring 228 may be larger than 90 degrees.

Figure 4:
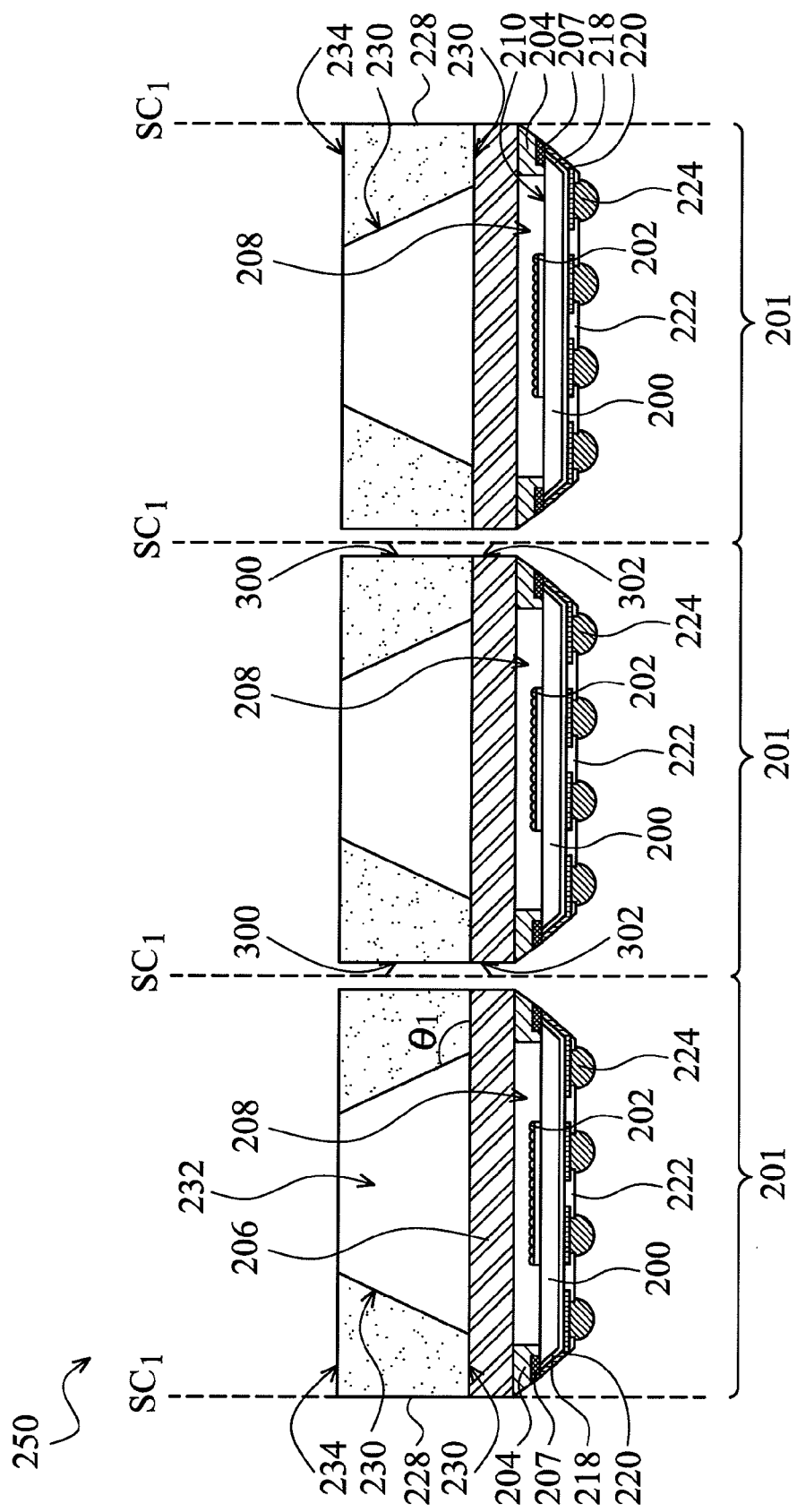

Next, referring to FIG. 4, the wafer 200 is diced along the scribe lines SC1 (also in positions of the through holes 214) to divide the wafer 200, the dam 204, the transparent plate 206 and the back spacer ring 228 into several individual first portions 250. Each of the first portions 250 may comprise an image sensor device package, which comprises an image sensor device chip 201, the transparent plate 206, the dam 201, the insulating layer 218, the conductive layer 220, the passivation layer 222, the conductive bumps 224, and the back spacer ring 228. As shown in FIG. 4, an edge 300 of the back spacer ring 228 is aligned to an edge 302 of the image sensor device package of each of the first portions 250. It is noted that the edge 300 of the back spacer ring 228 and the edge 302 of the image sensor device package are defined by the dicing process for the wafer 200.

Figure 5:
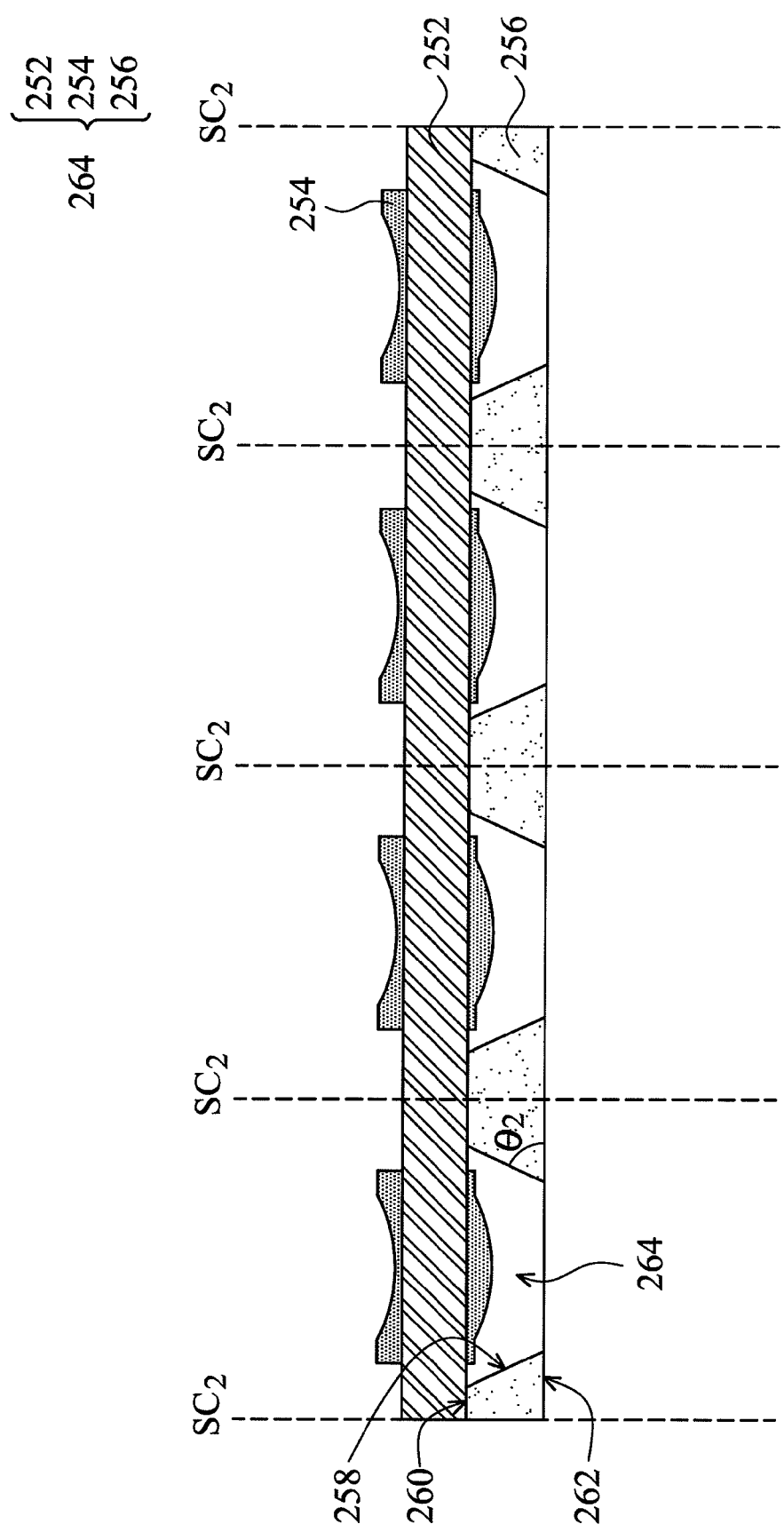

Additionally, as shown in FIG. 5, several second portions 264 isolated from one another by scribe lines SC2 are fabricated by providing a optical lens plate 252 having a plurality lenses 254 molded thereon using a wafer lens process. Next, a front spacer ring 256 is bonded to the optical lens plate 252, so that the front spacer ring 256 is underlying the front spacer ring 256. The front spacer ring 256 has cavities 264 formed therethrough and surrounds each of the lenses 254. As shown in FIG. 5, the front spacer ring 256 may have a lean inner sidewall 258. An angle $\theta_2$ between an inner sidewall 258 and the bottom surface 262 of the front spacer ring 256 is smaller than 90 degrees. In one embodiment, the front spacer ring 256 may be formed of materials similar to the back spacer ring 228 as shown in FIG. 4.

Figure 6:
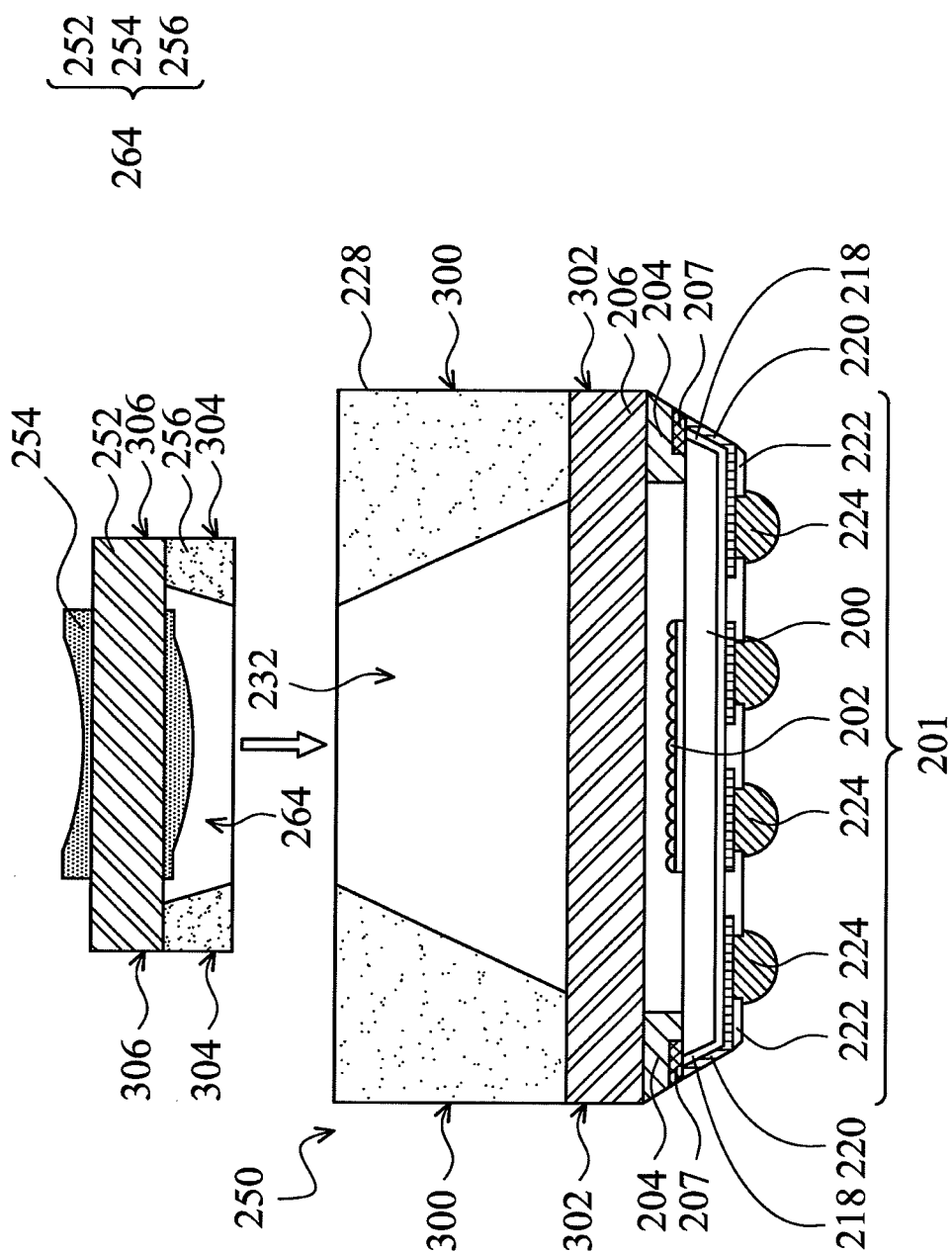

Next, the optical lens plate 252 is diced along the scribe lines SC2 (also positions among the lenses 254) to divide the optical lens plate 252 into several individual second portions 264 as shown in FIG. 6. As shown in FIG. 6, an edge 304 of the front spacer ring 256 is aligned to an edge 306 of the optical lens plate 252 of the second portion 264. It is noted that the 304 of the front spacer ring 256 and the edge 306 of the optical lens plate 252 are defined by the dicing process for the optical lens plate 252.

Figure 7:
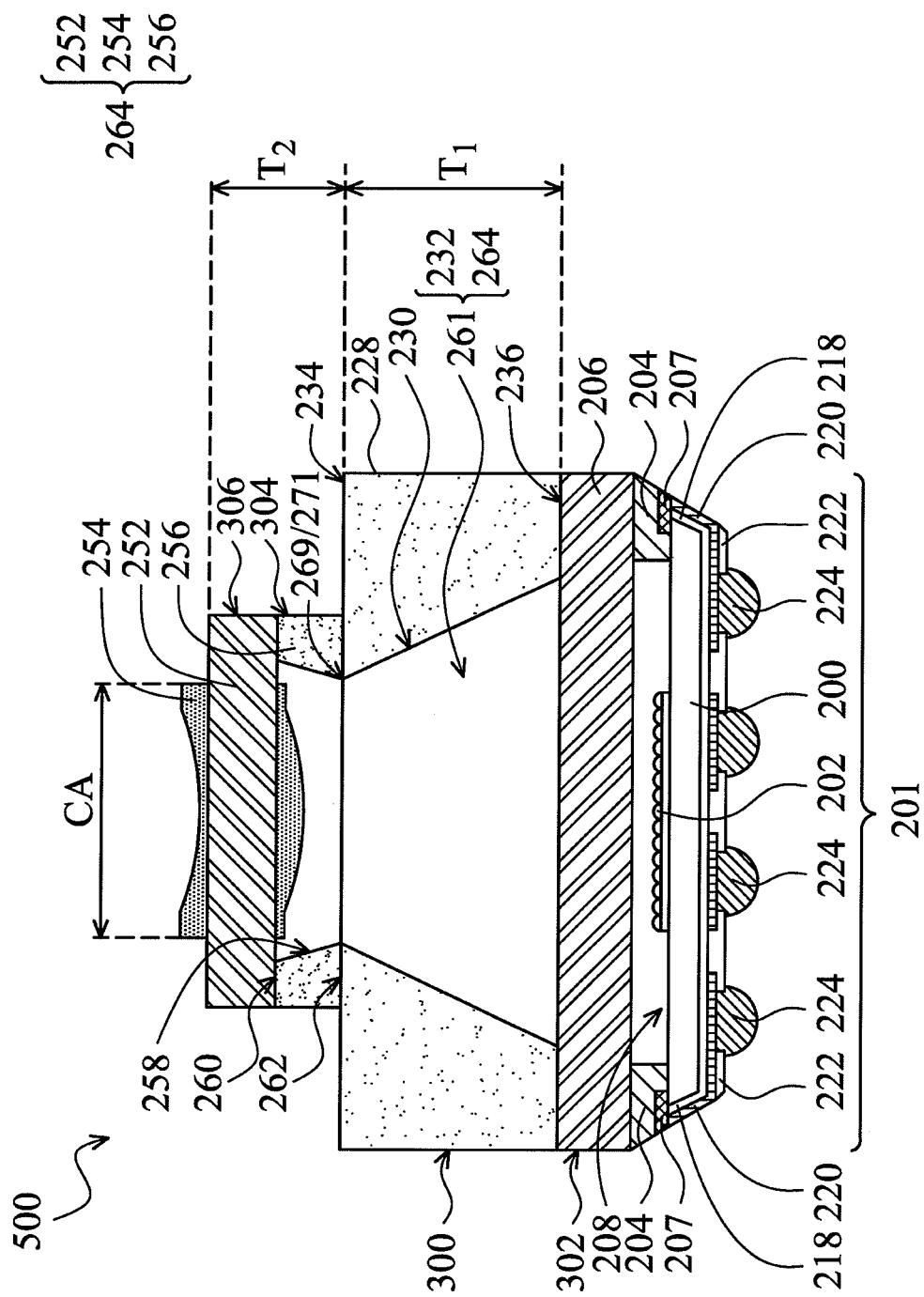

Next, as shown in FIG. 7, the second portion 264 is bonded onto the first portion 250 to form one exemplary embodiment of a compact camera module 500. The front spacer ring 256 is sandwiched between the back spacer ring 228 and the optical lens plate 252. As shown in FIG. 7, a portion of an upper surface 234 of the back spacer ring 228 is exposed from the front spacer ring 256. In one embodiment, a height $T_1$ of the back spacer ring 228 may be between 0.8 and 1.2 mm, and a height $T_2$ of the front spacer ring 256 may be between 0.2 and 0.5 mm smaller than the height $T_1$ of the back spacer ring 228. In one embodiment, a ratio of a width CA of the lens 254 to the first height $T_1$ of the back spacer ring 228 of the compact camera module 500 may be chosen to be between 0.4 and 1.3. The compact camera module 500 is formed by bonding the second portion 264 on the first portion 250, so that the cavity 232 through the back spacer ring 228 and the cavity 264 through the front spacer ring 256 are merged into a second cavity 261, which has a sandglass-shape, surrounded by the transparent plate 206, the back spacer ring 228, the front spacer ring 256 and the optical lens plate 252. The second cavity 261 is aligned to the first cavity 208. Therefore, an edge 269 shared by the inner sidewall 230 and a top surface 234 of the back spacer ring 228 is aligned to an edge 271 shared by the inner sidewall 258 and a bottom surface 262 of the front spacer ring 256 (that is, the edge 269 and the edge 271 are in the same position).

One exemplary embodiment of a compact camera module 500 may have several following advantages. The optical lens package unit of the compact camera module 500 may have a smaller size than the image sensor device package unit. Therefore, more optical lens package units can be fabricated in one wafer using the wafer lens processes. Therefore, fabrication costs are reduced. Additionally, the optical lens package unit is bonded to the image sensor device package unit in a final step. Therefore, reliability of the compact camera module is increased.

Figure 8:
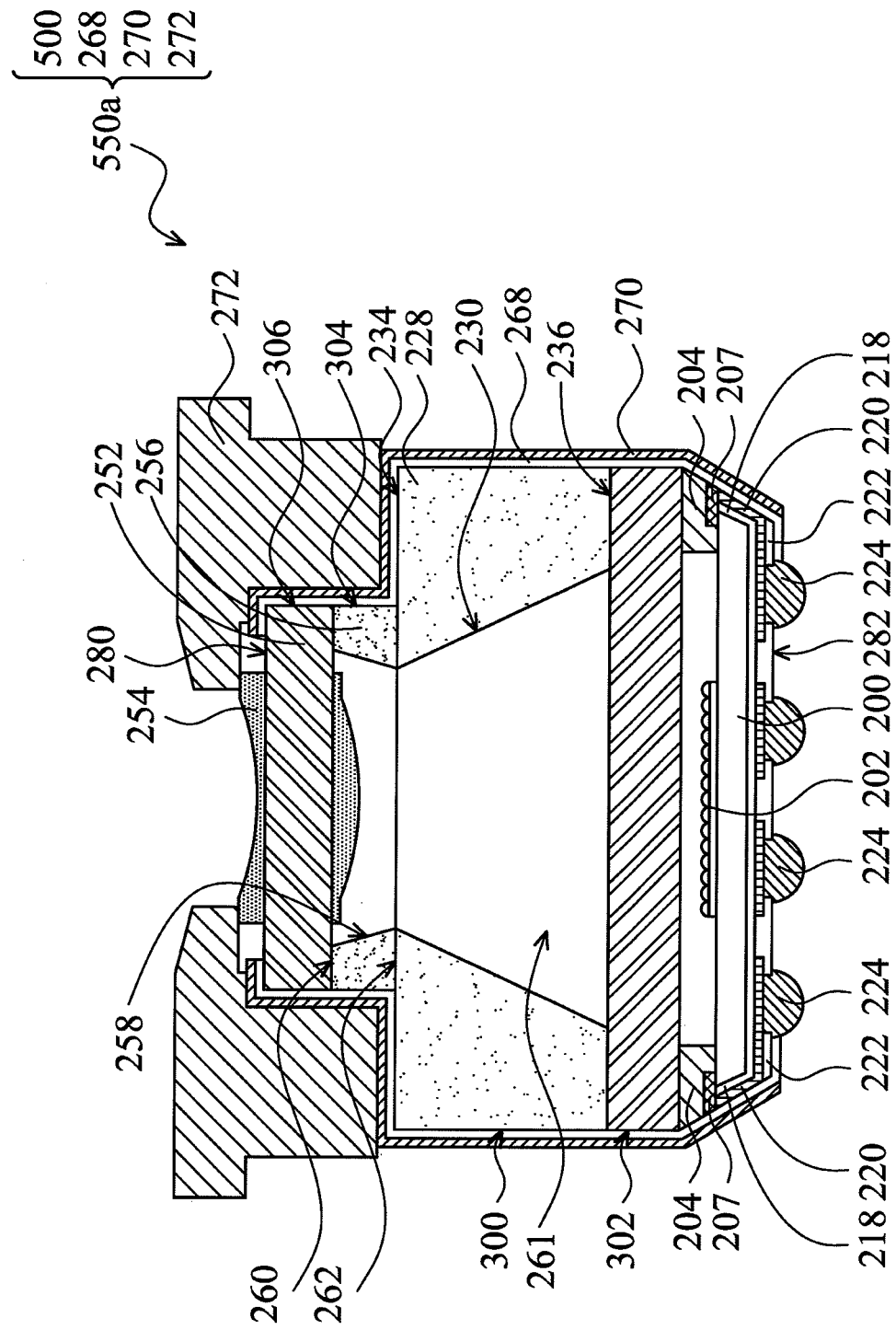
FIGS. 8-10 are cross section views of exemplary embodiments of a compact camera module with various passivation structures of the invention.
Figure 9:
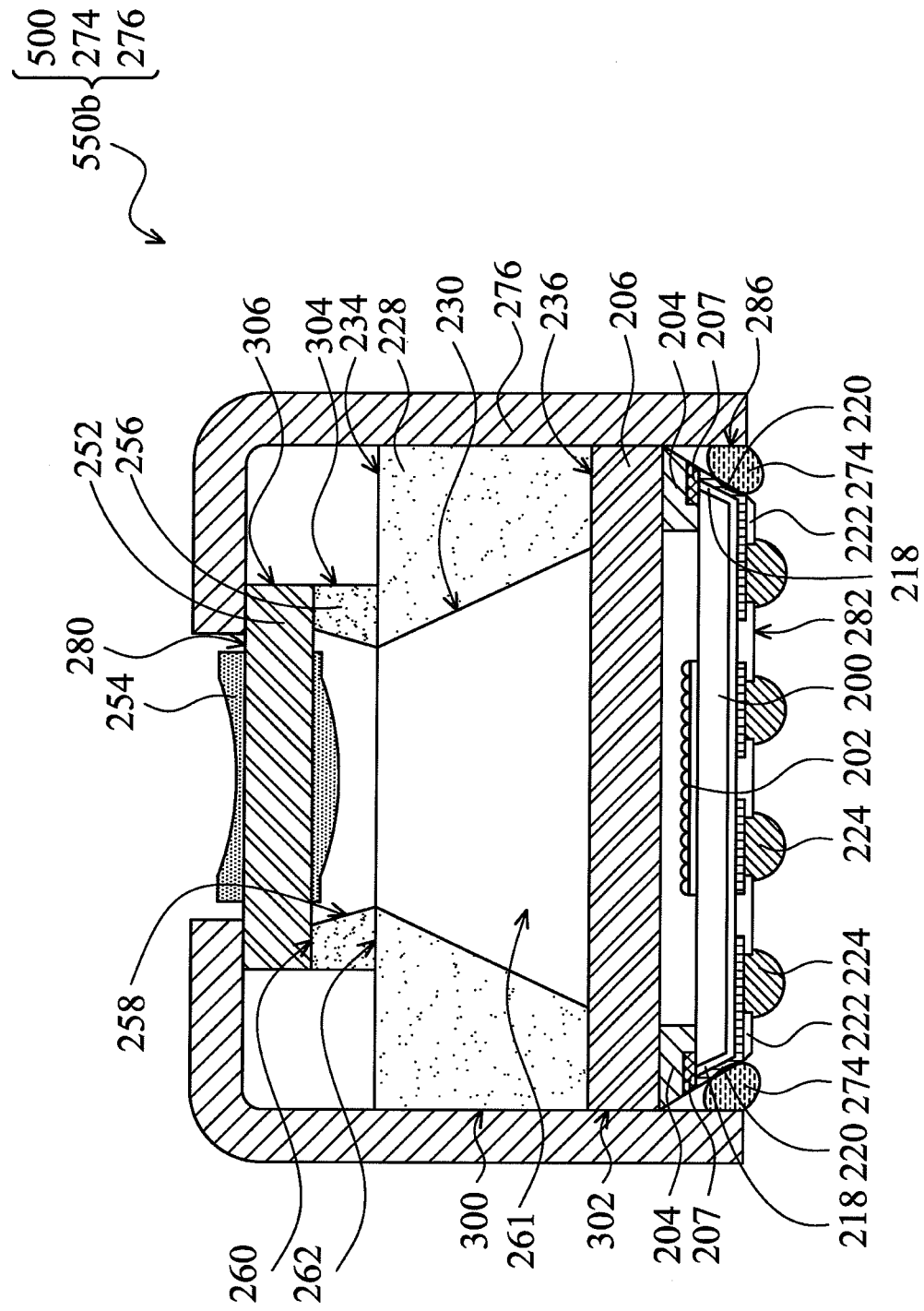
Figure 10:
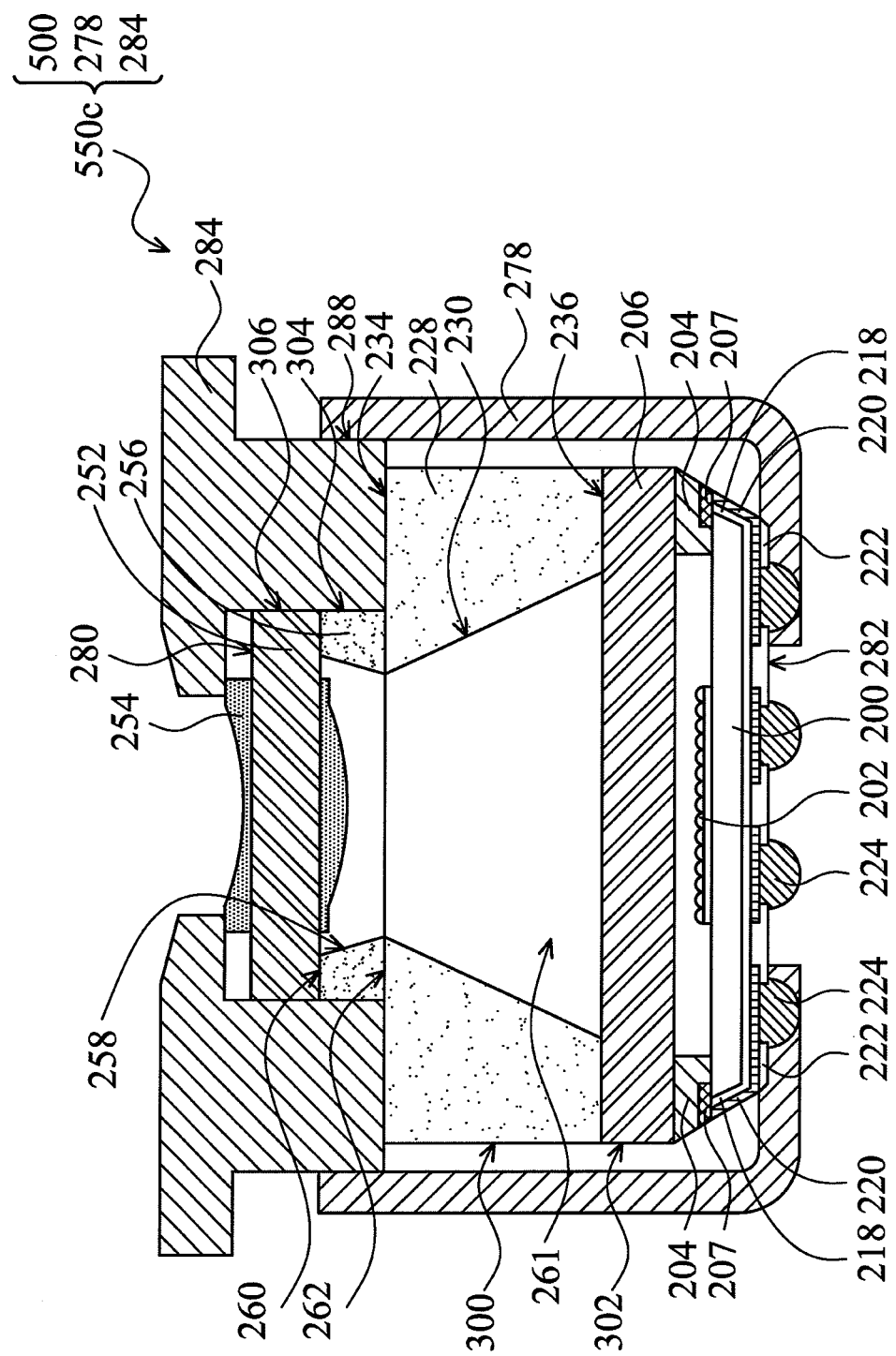

Additionally, the compact camera module 500 may be constructed with various passivation structures such as electromagnetic interference (EMI) shields, black shields or plastic caps for EMI or improved mechanical strength. FIGS. 8-10 are cross section views of exemplary embodiments of a compact camera module with various passivation structures of the invention. As shown in FIG. 8, after the compact camera module 500 is fabricated, an EMI shield 268 conformably surrounds the sidewall 302 of the image sensor device package, the sidewall 300 of the back spacer ring 228, the sidewall 304 of the front spacer ring 256 and the sidewall 306 of the optical lens plate 252. A portion of an upper surface 280 and the lens 254 of the optical lens plate 252 and a lower surface 282 of the image sensor device package are exposed from the EMI shield 268. Next, a black shield 270, to block scattered light, may be formed surrounding the EMI shield 268. Also, a portion of the upper surface 280 and the lens 254 of the optical lens plate 252 and the lower surface 282 of the image sensor device package are exposed from the black shield 270. Additionally, a plastic cap 272 may be formed over the back spacer ring 228 and surrounding the front spacer ring 256 to improve mechanical strength of the whole structure of the compact camera module 500. The lens 254 is exposed from the plastic cap 272. The plastic cap 272 surrounds a portion of a sidewall of the black shield 270. Therefore, one exemplary embodiment of a passivated compact camera module 550a comprising the compact camera module 500, the EMI shield 268, the black shield 270 and the plastic cap 272 is fabricated completed.

FIG. 9 shows a cross section of another exemplary embodiment of a passivated compact camera module 550b. As shown in FIG. 9, after the compact camera module 500 is fabricated, an EMI metal shield 276 may be formed surrounding the sidewall 302 of the image sensor device package, the sidewall 300 of the back spacer ring 228, the sidewall 304 of the front spacer ring 256 and the sidewall 306 of the optical lens plate 252. A portion of an upper surface 280 and the lens 254 of the optical lens plate 252 and a lower surface 282 of the image sensor device package are exposed from the EMI metal shield 276. The EMI metal shield 276 has a rigid tube shape. The rigid tube shaped EMI metal shield 276 may have EMI shielding functions and the ability to block scattered light. Also, the rigid tube shaped EMI metal shield 276 may have good mechanical strength to protect the compact camera module 500. The EMI metal shield 276 spaces apart from the sidewalls 304 and 306 of the front spacer ring 256 and the optical lens plate 252. A space between a sidewall of the image sensor chip 201 of the image sensor package 250 and a sidewall 286 of the EMI metal shield 276 may be filled with a conductive glue 274. Therefore, completing fabrication of another exemplary embodiment of a passivated compact camera module 550b comprising the compact camera module 500, the conductive glue 274 and the EMI metal shield 276.

FIG. 10 shows a cross section of yet another exemplary embodiment of a passivated compact camera module 550c. As shown in FIG. 10, after the compact camera module 500 is fabricated, an EMI metal shield 277 may be formed surrounding the sidewall 302 of the image sensor device package, the sidewall 300 of the back spacer ring 228, the sidewall 304 of the front spacer ring 256 and the sidewall 306 of the optical lens plate 252. Also, the EMI metal shield 277 spaces apart from the sidewall 300 of the back spacer ring 228, the sidewall 304 of the front spacer ring 256 and the sidewall 306 of the optical lens plate 252. A portion of the upper surface 280 and the lens 254 of the optical lens plate 252 and a lower surface 282 of the image sensor device package are exposed from the EMI metal shield 278. In one embodiment, the EMI metal shield 278 has a rigid tube shape, and functions of the EMI metal shield 278 is similar to the EMI metal shield 276 as shown in FIG. 9. Additionally, a plastic cap 284 may be formed over the back spacer ring 228 and surrounding the front spacer ring 256. The plastic cap 284 fills a space between the sidewall 306 of the optical lens plate 252 and the inner sidewall 288 of the EMI metal shield 278 for further mechanical strength improvement. Therefore, yet another exemplary embodiment of a passivated compact camera module 550c comprising the compact camera module 500, the EMI metal shield 278 and the plastic cap 284 is fabricated completed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A compact camera module, comprising:
   an image sensor device package;
   a back spacer ring disposed on the image sensor device package, wherein a first outside edge of the back spacer ring is aligned to a second outside edge of the image sensor device package;
   an optical lens plate disposed over the back spacer ring; and
   a front spacer ring sandwiched between the back spacer ring and the optical lens plate, wherein a third edge of the front spacer ring is aligned to a fourth edge of the optical lens plate,
   wherein a portion of an upper surface of the back spacer ring is exposed from the front spacer ring.

2. The compact camera module as claimed in claim 1, wherein the optical lens plate comprises a lens thereon, and a ratio of a width of the lens to a height of the back spacer ring is between 0.4 and 1.3.

3. The compact camera module as claimed in claim 1, wherein a fifth edge shared by an inner sidewall and a top surface of the back spacer ring is aligned to a sixth edge shared by an inner sidewall and a bottom surface of the front spacer ring.

4. The compact camera module as claimed in claim 3, wherein a first angle between the inner sidewall and the bottom surface of the back spacer ring is larger than 90 degrees from a cross-section view of the compact camera module.

5. The compact camera module as claimed in claim 3, wherein a second angle between the inner sidewall and the bottom surface of the front spacer ring is smaller than 90 degrees from a cross-section view of the compact camera module.

6. The compact camera module as claimed in claim 1, wherein the image sensor device package comprises:
   an image sensor device chip;
   a transparent plate covering the image sensor device chip;
   a dam between the transparent plate and the image sensor device chip, surrounding a first cavity, wherein the image sensor device chip disposed in the first cavity;
   an insulating layer formed on a sidewall and a lower surface of the image sensor device chip;
   a conductive layer formed over the insulating layer, wherein the conductive layer electrically connects to the image sensor device chip;
   a passivation layer covering the lower surface of the sensor chip; and
   a conductive bump formed on the passivation layer, electrically connected to the conductive layer.

7. The compact camera module as claimed in claim 6, further comprising a second cavity surrounded by the transparent plate, the back spacer ring, the front spacer ring and the optical lens plate, wherein the second cavity is aligned to the first cavity.

8. The compact camera module as claimed in claim 7, wherein the second cavity has a sandglass-shape.

9. The compact camera module as claimed in claim 1, further comprising a shield surrounding sidewalls of the image sensor device package, the back spacer ring, the front spacer ring and the optical lens plate, wherein an upper surface of the optical lens plate and a lower surface of the image sensor device package are exposed from the shield.

10. The compact camera module as claimed in claim 9, further comprising a plastic cap over the back spacer ring and surrounding the front spacer ring.

11. The compact camera module as claimed in claim 9, wherein the shield has a rigid tube shape.

12. The compact camera module as claimed in claim 11, wherein the shield spaces apart from the sidewalls of the front spacer ring and the optical lens plate.

13. The compact camera module as claimed in claim 11, wherein the shield spaces apart from the sidewalls of the back spacer ring, the front spacer ring and the optical lens plate.

14. A method for fabricating a compact camera module, comprising:
   providing a first portion comprising an image sensor device package with a back spacer ring bonded thereon, wherein a first outside edge of the back spacer ring is aligned to a second outside edge of the image sensor device package, wherein providing the first portion comprises:
      providing a wafer having a image sensor device chip;
      bonding a transparent plate to an upper surface of the wafer by a dam therebetween;
      forming through holes through the wafer, wherein the through holes are adjacent edges of the image sensor device chip;
      covering a lower surface of the wafer with a passivation layer;
      forming conductive bumps on the passivation layer, electrically connected to the image sensor device chip;
      bonding the back spacer ring on the wafer, and connecting to the transparent plate; and
      dicing the wafer, the transparent plate and the back spacer ring along the through holes;
   providing a second portion comprising an optical lens plate with a front spacer ring bonded thereunder, wherein a third outside edge of the front spacer ring is aligned to a fourth outside edge of the optical lens plate; and
   bonding the second portion onto the first portion, wherein the front spacer ring is sandwiched between the back spacer ring and the optical lens plate.

15. The method for fabricating a compact camera module as claimed in claim 14, wherein providing the second portion comprises:
   providing a optical lens plate having a transparent plate and a lens thereon; and
   bonding a front spacer ring onto the transparent plate, wherein the front spacer ring surrounds the lens; and
   dicing the optical lens plate and the front spacer ring along a scribe line of the optical lens plate.

16. The method for fabricating a compact camera module as claimed in claim 14, further comprising:
   forming a shield surrounding sidewalls of the image sensor device chip, the back spacer ring, the front spacer ring and the optical lens plate, wherein an upper surface of the optical lens plate and a lower surface of the image sensor device chip are exposed from the shield.

17. The method for fabricating a compact camera module as claimed in claim 16, further comprising:
   forming a plastic cap over the back spacer ring and surrounding the front spacer ring.

18. The method for fabricating a compact camera module as claimed in claim 16, further comprising:
   filling a conductive glue into a space between the sidewall of the image sensor package and a sidewall of the shield.

* * * * *